(12) United States Patent
Seefeldt

(10) Patent No.: US 6,627,954 B1
(45) Date of Patent: Sep. 30, 2003

(54) INTEGRATED CIRCUIT CAPACITOR IN A SILICON-ON-INSULATOR INTEGRATED CIRCUIT

(75) Inventor: James D. Seefeldt, DeForest, WI (US)

(73) Assignee: Silicon Wave, Inc., San Diego, CA (US)

( * ) Notice: Subject to any disclaimer, the term of this patent is extended or adjusted under 35 U.S.C. 154(b) by 0 days.

(21) Appl. No.: 09/272,822

(22) Filed: Mar. 19, 1999

(51) Int. Cl.$^7$ .................. H01L 27/01; H01L 27/12; H01L 31/0392
(52) U.S. Cl. .................. 257/350; 257/348; 257/347; 257/351; 257/565
(58) Field of Search .................. 257/347, 349, 257/350, 348, 351

(56) References Cited

U.S. PATENT DOCUMENTS

| | | | |
|---|---|---|---|
| 5,144,308 A | 9/1992 | Norsworthy | 341/131 |
| 5,241,211 A * | 8/1993 | Tahiro | 257/506 |
| 5,279,978 A | 1/1994 | See et al. | 437/34 |
| 5,294,823 A | 3/1994 | Eklund et al. | 257/370 |
| 5,424,739 A | 6/1995 | Norsworthy et al. | 341/143 |
| 5,430,317 A | 7/1995 | Onai et al. | 257/347 |
| 5,449,953 A | 9/1995 | Nathanson et al. | 257/728 |
| 5,498,885 A | 3/1996 | Deen et al. | 257/139 |
| 5,578,970 A | 11/1996 | Nguyen et al. | 331/75 |
| 5,619,069 A | 4/1997 | Ohta et al. | 257/692 |
| 5,621,239 A * | 4/1997 | Horie et al. | 257/499 |
| 5,643,805 A | 7/1997 | Ohta et al. | 437/31 |
| 5,661,329 A | 8/1997 | Hiramoto et al. | 257/510 |
| 5,684,482 A | 11/1997 | Galton | 341/144 |
| 5,745,061 A | 4/1998 | Norsworthy et al. | 341/131 |
| 5,747,846 A * | 5/1998 | Iida et al. | 257/314 |
| 5,773,340 A | 6/1998 | Kumauchi et al. | 438/234 |
| 5,920,108 A * | 7/1999 | Hemmenway et al. | 257/508 |
| 5,952,694 A * | 9/1999 | Miyawaki et al. | 257/347 |
| 6,172,378 B1 * | 1/2001 | Hull et al. | 257/14 |

FOREIGN PATENT DOCUMENTS

| | | | |
|---|---|---|---|
| FR | 2323229 | 4/1977 | |
| JP | 6053422 A | 2/1994 | H01L/27/06 |
| JP | 8241999 | 9/1996 | H01L/29/786 |
| WO | WO 97/02602 | 1/1997 | H01L/27/12 |

OTHER PUBLICATIONS

Bluetooth Special Interest Group website http://www.bluetooth.com; "Bluetooth—Document Page", including "Technology Overview", "Radio", "Baseband", "Link Management", "Software Framework", "PC General", "Telephone", "Others"; Date Unknown; pp. 1–10.

(List continued on next page.)

*Primary Examiner*—Sheila V. Clark
*Assistant Examiner*—Jesse A. Fenty
(74) *Attorney, Agent, or Firm*—Martin J. Jaquez, Esq.; Jaquez & Associates

(57) ABSTRACT

An integrated circuit capacitor includes a silicon-on-insulator (SOI) substrate and a doped epitaxial layer of a first conductivity type formed on the SOI substrate. The doped epitaxial layer is used as a first plate of the integrated circuit capacitor. A gate oxide layer is formed on the doped epitaxial layer and is used as a dielectric layer of the integrated circuit capacitor. A polysilicon gate is formed on the gate oxide layer and is used as a second plate of the integrated circuit capacitor. A method of forming an integrated circuit capacitor includes: establishing a silicon-on-insulator (SOI) substrate having an insulating layer formed on a substrate; forming a buried layer on the insulating layer; forming an epitaxial layer of a first conductivity type on the buried layer; forming a local oxidation silicon layer on the epitaxial layer that surrounds a first selected surface area of the epitaxial layer; implanting a collector into the epitaxial layer in the first selected surface area of the epitaxial layer; forming a gate oxide layer on the collector; and forming a polysilicon gate on the gate oxide layer and a first portion of the local oxidation silicon layer.

12 Claims, 14 Drawing Sheets

OTHER PUBLICATIONS

Durec, Jeff, "An Integrated Silicon Bipolar Receiver Subsystem for 900–Mhz ISM Band Applications" *IEEE Journal of Solid State Circuits* 33(9):1352–1372 (Sep. 1998).

Hashimoto et al., "A 6–$\mu$ m$^2$ bipolar transistor using 0.25–$\mu$ m process technology for high–speed applications" *IEEE Proceedings of the Bipolar BiCMOS Circuits and Technology Meeting*:152–155 (Sep. 1998).

U.S. patent application Ser. No. 09/216,040, Brown et al., filed Dec. 18, 1998.

U.S. patent application Ser. No. 09/255,747, Seefeldt, Feb. 23, 1999.

IEEE Personal Communications, "Figure 3. A Wireless–enhanced scenario for PCCAs", Dec. 1998, p. 1.

Kikuchi et al., "A 0.35$\mu$m ECL–CMOS Process Technology on SOI for 1ns Mega–bits SRAM's with 40ps Gate Array" *International Electronic Devices Meeting Technical Digest* 95:923–926 (Dec. 1995).

Sze, S.M., *Semiconductor Devices, Physics and Technology*. New Jersey, John Wiley & Sons, 1985., p. 468–472. ISBN 0–471–87424–8.

Kumamoto, Toshio, et al., "An SOI/CMOS Flash A/D Converter", Electronics & Communications in Japan, Part II—Electronics, US. Scripta Technica., New York, Nov. 1, 1989, pp. 30–37.

* cited by examiner

INTEGRATED CIRCUIT CAPACITOR IN A SILICON-ON-INSULATOR INTEGRATED CIRCUIT

CROSS-REFERENCE TO RELATED APPLICATIONS

The present invention is related to the following U.S. Applications: Application No.: 09/216,040, entitled "Apparatus and Method for Wireless Communications", filed Dec. 18, 1998, Abandoned; Application No.: 09/305,330, entitled "Apparatus and Method for Wireless Communications", filed May 4, 1999, Pending; Application No.: 09/255,747, entitled "Trench Isolated Guard Ring Region for Providing RF Isolation", filed Feb. 23, 1999, Abandoned; Application No.: 09/645,056, entitled "A Method of Providing Radio Frequency Isolation of Device Mesas Using Guard Ring Regions Within an Integrated Circuit Device", filed Aug. 23, 2000, Pending; and Application No.: 09/643,575, entitled "A Multi-Chambered Trench Isolated Guard Ring Region for Providing RF Isolation", filed Aug. 22, 2000, Pending. The present invention is also related to U.S. Pat. No. : 6,172,378, entitled "Integrated Circuit Varactor Having a Wide Capacitance Range", issued on Jan, 9, 2001.

BACKGROUND OF THE INVENTION

1. Field of the Invention

The present invention relates to integrated circuit capacitors in semiconductor integrated circuits (ICs), and more particularly, to integrated circuit capacitors in silicon-on-insulator (SOI) integrated circuits.

2. Description of the Related Art

In general, discrete capacitors typically include a dielectric material that separates two parallel plates. They are used to hold charge or to transmit an AC signal and block a DC signal. Capacitance is the amount of charge a capacitor can hold per volt and is measured in farads (F).

The textbook entitled "Semiconductor Devices: Physics and Technology", by S.M. Sze (John Wiley & Sons, 1985), provides a brief discussion of integrated circuit capacitors in Chapter 12. As stated therein, there are basically two types of capacitors that have been used in ICs: MOS capacitors and p-n junctions. A typical MOS (metal-oxide-semiconductor) capacitor, illustrated in FIGS. 1A and 1B, can be fabricated by using a heavily doped region 20 (such as an emitter region) as one plate, the top metal electrode 22 as the other plate, and the intervening oxide layer 24 as the dielectric. To form a MOS capacitor, a thick oxide layer 26 is thermally grown on a silicon substrate 28. Next, a window is lithographically defined and then etched in the oxide. Diffusion or ion implantation is used to form a p+ -region 20 in the window area, while the surrounding thick oxide 26 serves as a mask. A thin oxide layer 24 is then thermally grown in the window area, followed by a metallization step. The capacitance per unit area is given by:

$$C = \epsilon_{ox}/d \text{ F/cm}^2$$

where $\epsilon_{ox}$ is the dielectric permittivity of silicon dioxide (the dielectric constant $\epsilon_{ox}/\epsilon_O$ is 3.9) and d is the thin-oxide thickness. To increase the capacitance further, insulators with higher dielectric constants have been suggested, such as for example, $Si_3N_4$ and $Ta_2O_5$ with dielectric constants of 8 and 22, respectively. The MOS capacitance is essentially independent of the applied voltage, because the lower plate 20 of the capacitor is made of heavily doped material. This also reduces the series resistance associated with it.

The p-n junction is sometimes used as a capacitor in an integrated circuit. FIGS. 2A and 2B illustrates an n+–p junction capacitor, the structure of which forms part of a bipolar transistor. As a capacitor, the device is usually reverse-biased, i.e., the p-region 30 is reverse-biased with respect to the n+–region 32. The capacitance is not a constant but varies as $(V_R+V_{bi})^{-\frac{1}{2}}$, where $V_R$ is the applied voltage and $V_{bi}$ is the built-in potential. The series resistance is considerably higher than that of a MOS capacitor because the p-region 30 has higher resistivity than does the p+ -region.

One disadvantage of the MOS capacitor of FIGS. 1A and 1B is that it includes a significant parasitic (or junction) capacitance component due to the substrate material 28. Variations in the applied voltage may result in variations in this parasitic capacitance which may result in possible frequency modulation of the signal. Such frequency modulation can be detrimental in analog ICs, such as for example, ICs used in wireless communications applications. Specifically, wireless communications devices use high-frequency signals: 900 MHz to 1900 MHz for cellular phones and higher (up to 6 GHz) for other systems, such as wireless LANs. The proposed Bluetooth standard calls for operation in the unlicensed ISM band at 2.4 GHz. Signals at such frequencies, i.e., high radio frequencies (RF), are difficult to generate and control. They also have a tendency to interfere with each other, as they are easily coupled by parasitic properties present in all electronic components, including ICs. In ICs, many of the undesirable parasitic effects result from the conductive silicon substrate on which the circuit components, including capacitors, are fabricated. Therefore, the parasitic capacitance component of MOS integrated capacitors can interfere with the RF signals in wireless communication ICs.

Another disadvantage of the MOS capacitor shown in FIGS. 1A and 1B is that there is no isolation provided. Isolation is important for ICs used in wireless communications applications. High isolation, and in particular, high RF isolation, implies that devices can be spaced closer together without adjacent elements interacting with each other, and die size is minimized. The parasitic capacitance to substrate of the integrated MOS capacitor combined with poor isolation can, for example, lead to an amount of local oscillator (LO) signal appearing at the output of the receiver and effectively be transmitted at the antenna. Wireless regulatory authorities limit the amount of spurious signal that can be radiated by the receiver, so limiting the amount of LO radiation is necessary to meet these specifications.

Yet another disadvantage of the MOS capacitor shown in FIGS. 1A and 1B is that it requires a significant amount of silicon area to make a large capacitor, i.e. a capacitor with a high capacitance value.

Thus, there is a need for an apparatus and method that provides an integrated circuit capacitor having a low parasitic capacitance to substrate, high isolation, and a high capacitance per unit area.

BRIEF SUMMARY OF THE INVENTION

The present invention provides an integrated circuit capacitor. The capacitor includes a silicon-on-insulator (SOI) substrate and a doped epitaxial layer of a first conductivity type formed on the SOI substrate. The doped epitaxial layer is used as a first plate of the integrated circuit capacitor. A gate oxide layer is formed on the doped epitaxial layer and is used as a dielectric layer of the integrated circuit capacitor. A polysilicon gate is formed on the gate oxide layer and is used as a second plate of the integrated circuit capacitor.

The present invention also provides an integrated circuit capacitor that includes a substrate and an insulating layer formed on the substrate. A buried layer is formed on the insulating layer, and an epitaxial layer of a first conductivity type formed on the buried layer. A local oxidation silicon layer is formed on the epitaxial layer that surrounds a first selected surface area of the epitaxial layer. A collector is implanted into the epitaxial layer in the first selected surface area of the epitaxial layer. A gate oxide layer is formed on a first portion of the collector, and a polysilicon gate is formed on the gate oxide layer and a first portion of the local oxidation silicon layer.

The present invention also provides a method of forming an integrated circuit capacitor. The method includes: establishing a silicon-on-insulator (SOI) substrate having an insulating layer formed on a substrate; forming a buried layer on the insulating layer; forming an epitaxial layer of a first conductivity type on the buried layer; forming a local oxidation silicon layer on the epitaxial layer that surrounds a first selected surface area of the epitaxial layer; implanting a collector into the epitaxial layer in the first selected surface area of the epitaxial layer; forming a gate oxide layer on the collector; and forming a polysilicon gate on the gate oxide layer and a first portion of the local oxidation silicon layer.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

Figure 1A:
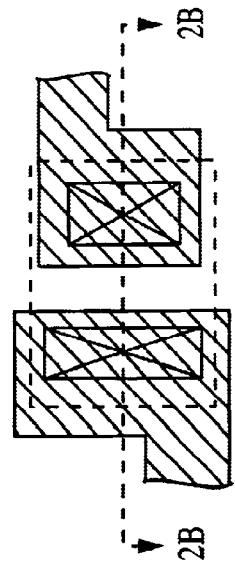
FIGS. 1A, 1B, 2A and 2B are top plan views and cross-sectional views illustrating conventional integrated circuit capacitors.
Figure 2A:
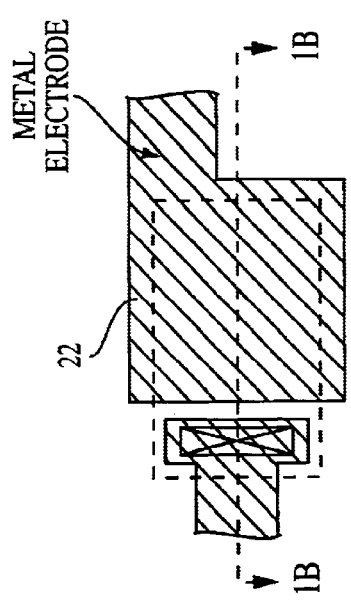
Figure 1B:
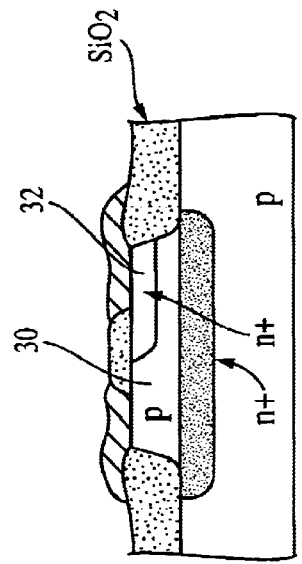
Figure 2B:
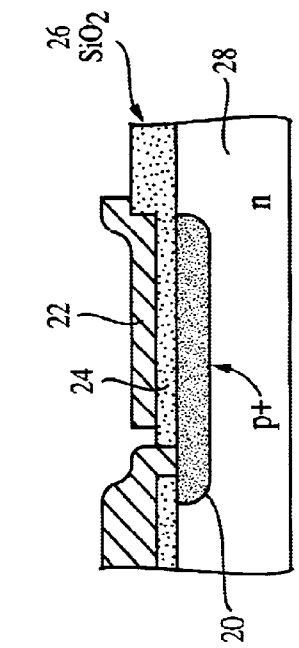
Figure 3:
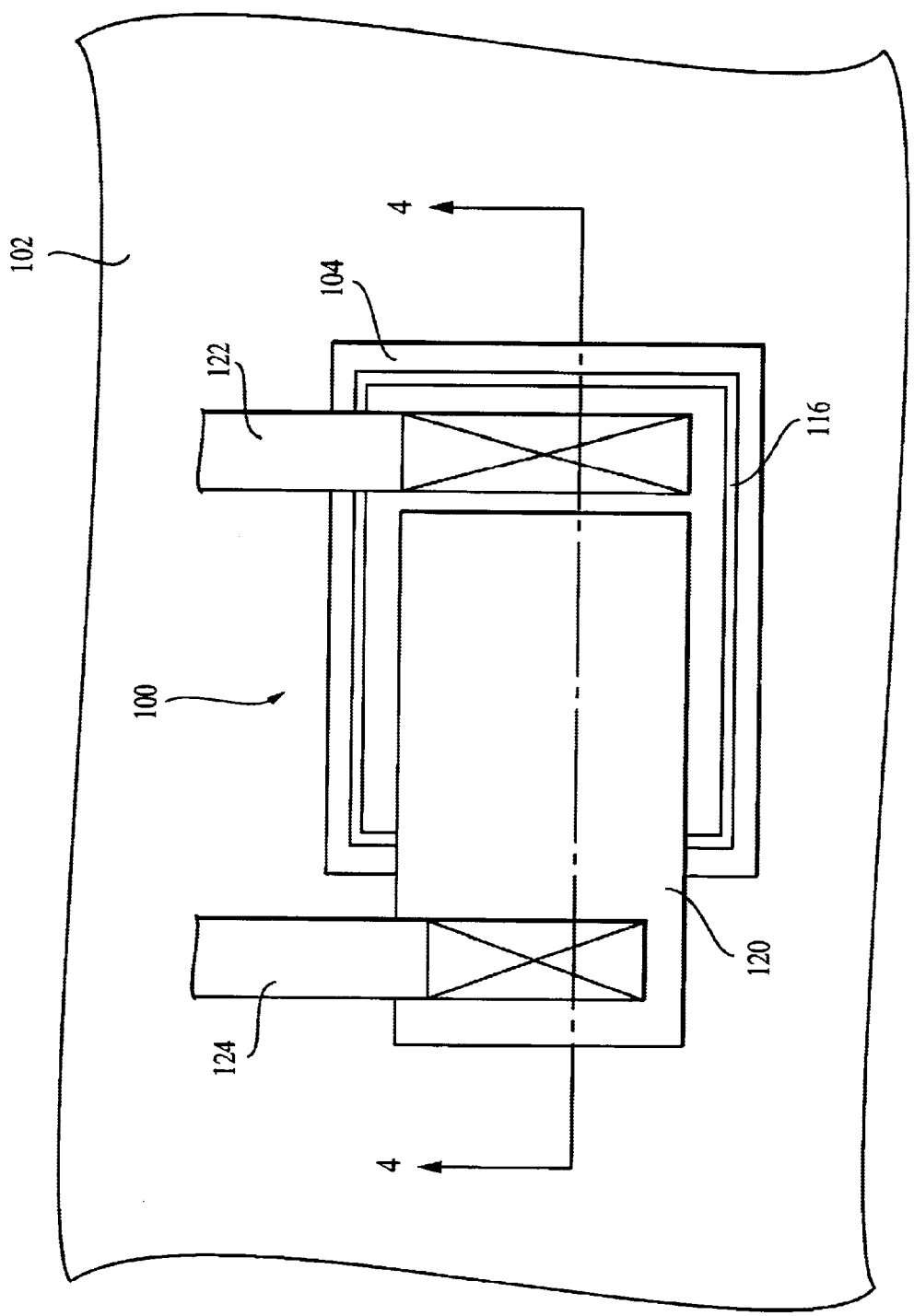
FIG. 3 is a top plan view illustrating an integrated circuit capacitor in accordance with the present invention.

Referring to FIG. 3, there is illustrated an integrated circuit capacitor 100 in accordance with the present invention. The capacitor 100 has a low parasitic capacitance to substrate, high isolation, and a high capacitance per unit area, thus overcoming the disadvantages of the MOS capacitor of FIGS. 1A and 1B. The capacitor 100 also has a high quality factor, or "Q".

The capacitor 100 includes an isolation trench 104 to provide isolation for the capacitor 100. The isolation trench 104 may be filled with silicon oxide $SiO_2$ or some other material, such as for example, oxide/polysilicon. Dielectric trench isolation structures provide lateral barriers between circuit elements. It should be understood that additional isolation trenches may be included in the SOI substrate 102 to provide additional isolation. Other isolation schemes may also-be employed, such as for example, guard rings. Guard rings are substrate contacts that enclose the area to be isolated. These techniques isolate signals and minimize the undesired coupling that would otherwise limit performance for closely spaced adjacent circuit elements. An example of an isolation scheme that may be used in the present invention is the isolation The capacitor 100 is preferably fabricated on a silicon-on-insulator (SOI) substrate 102, but it should be understood that the teachings of the present invention can be applied to non-SOI substrates as well. With SOI, an insulating layer separates circuit devices from the solid silicon substrate. An example of one particular SOI technology that may be used is the bonded SOI BiCMOS process technology that is available from Hitachi Ltd. of Japan, and specifically, the Hitachi Ltd. Device Development Center in Tokyo, Japan. This SOI BiCMOS process technology is also described in U.S. Pat. No. 5,661,329 entitled "Semiconductor Integrated Circuit Device Including An Improved Separating Groove Arrangement", U.S. Pat. No. 5,773,340 entitled "Method of Manufacturing a BIMIS", and U.S. Pat. No. 5,430,317 entitled "Semiconductor Device", the complete disclosures of which are all hereby fully incorporated into the present application by reference. Furthermore, this SOI BiCMOS process technology is also described in the paper entitled "A 0.35 $\mu$m ECL-CMOS Process Technology on SOI for 1 ns Mega-bits SRAM's with 40 ps Gate Array" by T. Kikuchi, Y. Onishi, T. Hashimoto, E. Yoshida, H. Yamaguchi, S. Wada, N. Tamba, K. Watanabe, Y. Tamaki, and T. Ikeda of the Hitachi Ltd. Device Development Center, Tokyo, Japan, published in the IEDM Technical Digest, IEDM 95-923, in connection with the International Electron Devices Meeting, Dec. 10–130, 1995, 0-7803-2700-4, 1995 IEEE, the complete disclosure of which is hereby fully incorporated into the present application by reference. An SOI process technology is also described in the paper entitled "A 6 $\mu$m2 bipolar transistor using 0.25 $\mu$m process technology for high-speed applications" by T. Hashimoto,T. Kikuchi, K. Watanabe, S. Wada, Y. Tamaki, M. Kondo, N. Natsuaki, and N. Owada of the Hitachi Ltd. Device Development Center, Tokyo, Japan, published in IEEE BCTM 9.1, 0-7803-4497-9/98, 1998 IEEE, the complete disclosure of which is hereby fully incorporated into the present application by reference. It should be well understood that the Hitachi SOI process is just one example of an SOI process that may be used and that other SOI processes may be used in accordance with the present invention.

The capacitor 100 includes an isolation trench 104 to provide isolation for the capacitor 100. The isolation trench 104 may be filled with silicon oxide $SiO_2$ or some other material, such as for example, oxide/polysilicon. Dielectric trench isolation structures provide lateral barriers between circuit elements. It should be understood that additional isolation trenches may be included in the SOI substrate 102 to provide additional isolation. Other isolation schemes may also-be employed, such as for example, guard rings. Guard rings are substrate contacts that enclose the area to be isolated. These techniques isolate signals and minimize the undesired coupling that would otherwise limit performance for closely spaced adjacent circuit elements. An example of an isolation scheme that may be used in the present invention is the isolation scheme described in U.S. application Ser. No. 09/255,747, filed Feb. 23, 1999, entitled "TRENCH ISOLATED GUARD RING REGION FOR PROVIDING RF ISOLATION", invented by James D. Seefeldt, and commonly assigned herewith, abandoned. Other examples of isolation schemes that may be used in the present invention are provided by the following U.S. applications and issued U.S. Patent: (1) the isolation scheme described in commonly assigned and copending U.S. application Ser. No. 09/645,056, filed Aug. 23, 2000, entitled "A Method of Providing Radio Frequency Isolation of Device Mesas Using Guard Ring Regions", invented by James D. Seefeldt; (2) the isolation scheme described in commonly assigned and copending U.S. application Ser. No.: 09/643,575, filed Aug. 22, 2000, entitled "A Multi-Chambered Trench slated Guard Ring Region for Providing RF Isolation", invented by Librizzi, et al.; and (3) U.S. Pat. No. : 6,172,378, issued Jan. 9, 2001 to Hull et al., entitled "Integrated Circuit Varactor Having a Wide Capacitance Range, the full disclosures of which are incorporated into the present application by reference for their teachings on trench isolation of integrated circuit devices.

Figure 4:
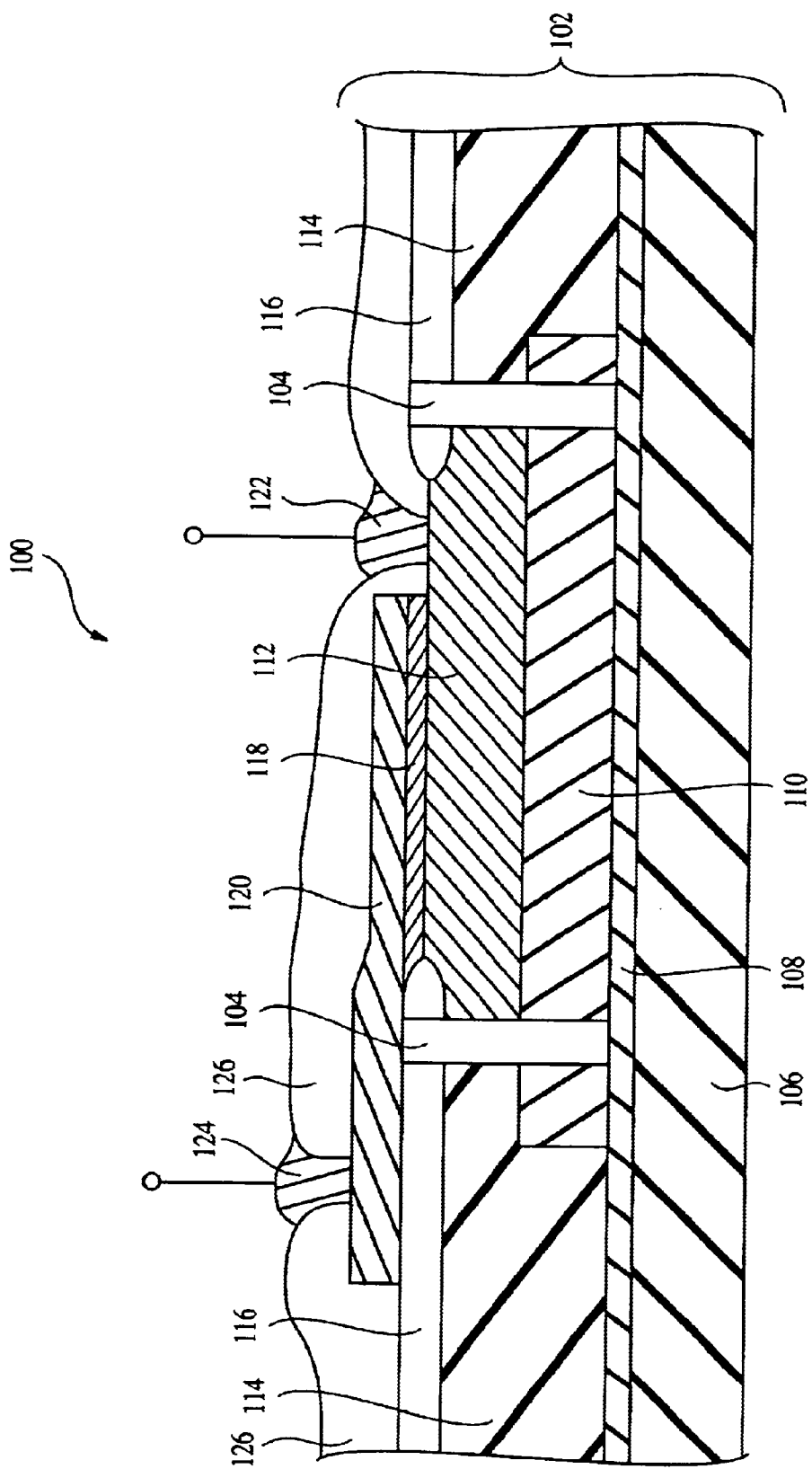
FIG. 4 is a cross-sectional view illustrating the integrated circuit capacitor of FIG. 3 taken along line 4—4.

Referring to FIG. 4, the capacitor 100 generally includes trench 104 isolation, an n-type: buried layer 110, an n-type collector 112 implanted in the epitaxial region 114, and a gate oxide capacitor. Specifically, the SOI substrate 102 includes a silicon support substrate 106 and an insulating layer 108 that separates the capacitor 100 from the silicon support substrate 106. By way of example, the support substrate 106 may be formed of a p⁻-type semiconductor substrate of a silicon single crystal, and the insulating layer 108 may be formed of a silicon oxide film, also referred to as SOI oxide. The support substrate 106 is preferably formed of a high resistivity (or high Z) substrate having a high ohmn per centimeter rating, such as for example, a 1 KΩ per centimeter substrate. While a 1 KΩ per centimeter substrate performs very well, it should be understood that a substrate is considered herein to be a high resistivity (or high Z) substrate if it has an ohm per centimeter rating above approximately 100Ω per centimeter.

An n-type buried layer (NBL) 110 is formed on the insulating layer 108, and a surrounding field epitaxial region 114 is formed on the buried layer 110. An n-type collector (CN) 112 is implanted into the epitaxial region 114. The collector 112 is preferably heavily doped. It should be understood that the buried layer 110 and the collector 112 may alternatively be formed from p-type material.

A local oxidation silicon layer 116 ("LOCOS") is formed on the epitaxial layer 114 and surrounds a selected surface area of the epitaxial layer 114 where the collector 112 is implanted. The isolation trench 104 is formed in the epitaxial layer 114 and the buried layer 110 and extends to the insulating layer 108. The isolation trench 104 also surrounds the selected surface area of the epitaxial layer 114 where the collector 112 is implanted. A gate oxide layer 118 is formed on the collector 112, and a polysilicon gate 120 is formed on the gate oxide layer 118. The polysilicon gate 120 extends beyond the selected surface area of the epitaxial layer 114 where the collector 112 is implanted and over a portion of the LOCOS 116. A first metal contact 122 is made to the exposed portion of the collector 112, and a second metal contact 124 is made to the polysilicon gate 120. Finally, a phosphorus-doped oxide 126 (P-glass) is deposited on the wafer.

During operation of the capacitor 100, the collector 112, i.e., the highly doped portion of the epitaxial layer 114, is used as a first plate of the capacitor 100, and the polysilicon gate 120 is used as a second plate of the capacitor 100. The gate oxide layer 118 is used as a dielectric layer of the capacitor 100.

The use of SOI helps to provide excellent RF isolation. Specifically, the insulating layer 108, i.e., the SOI oxide, provides additional RF isolation. The use of a high resistivity (or high Z) substrate 106 improves RF isolation by making the substrate 106 a high resistance path for RF power. Any leaking RF power will prefer the path of least resistance which will not be the substrate 106 if a high Z substrate is used.

The insulating layer 108 underneath the capacitor 100 structure provides insulation from the support substrate 106, and thus, reduces the parasitic capacitance caused by the substrate 106. The high resistivity of the support substrate 106 also helps to reduce the parasitic capacitance caused by the substrate 106. Furthermore, the highly doped collector 112 under the gate oxide layer 118 reduces the series resistance of the capacitor 100. This reduced series resistance increases the Q, or quality factor, of the capacitor 100. In general, Q is defined as the ratio of stored energy to dissipated energy per alternating current cycle, and for a capacitor Q is defined as the ratio of capacitive reactance to series resistance. Thus, reducing the series resistance of a capacitor increases its Q.

The highly doped collector 112 has a small impact on junction capacitance Cjs. This is because Cjs is dominated by the oxide in the trench 104 surrounding the collector 112. The substrate 106, if a high resistivity or "high Z" (e.g. 1 KΩ–cm) substrate, contributes less to Cjs than standard resistivity (10–300–cm) material. In addition, with a high Z substrate 106, RF power will take the path of least resistance through the lower resistivity epitaxial layer 114. This RF power is then blocked by isolation trench 104. Also, since the Cjs (with a high Z substrate) is now dominated by isolation trench 104, the majority of RF power that leaks will go out the side as opposed to the substrate 106.

The capacitor 100 has a higher capacitance per unit area than conventional metal to metal or metal to polysilicon capacitors because the capacitor dielectric is made of gate oxide which is grown very thin as opposed to the dielectrics between two metal layers or a metal layer and a polysilicon layer. This high capacitance per unit area results in the capacitor 100 being a high density capacitor.

Figure 5:
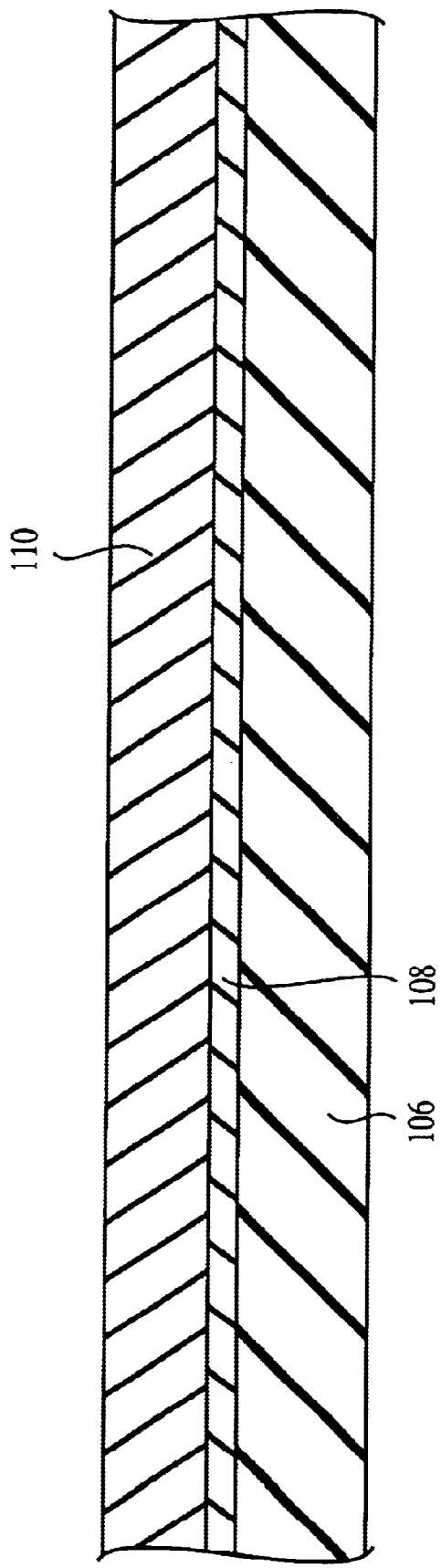
FIGS. 5, 6, 7, 8, 9, 10, 11, 12 and 13 are cross-sectional views illustrating a method in accordance with the present invention of manufacturing the integrated circuit capacitor shown in FIGS. 3 and 4.
Figure 6:
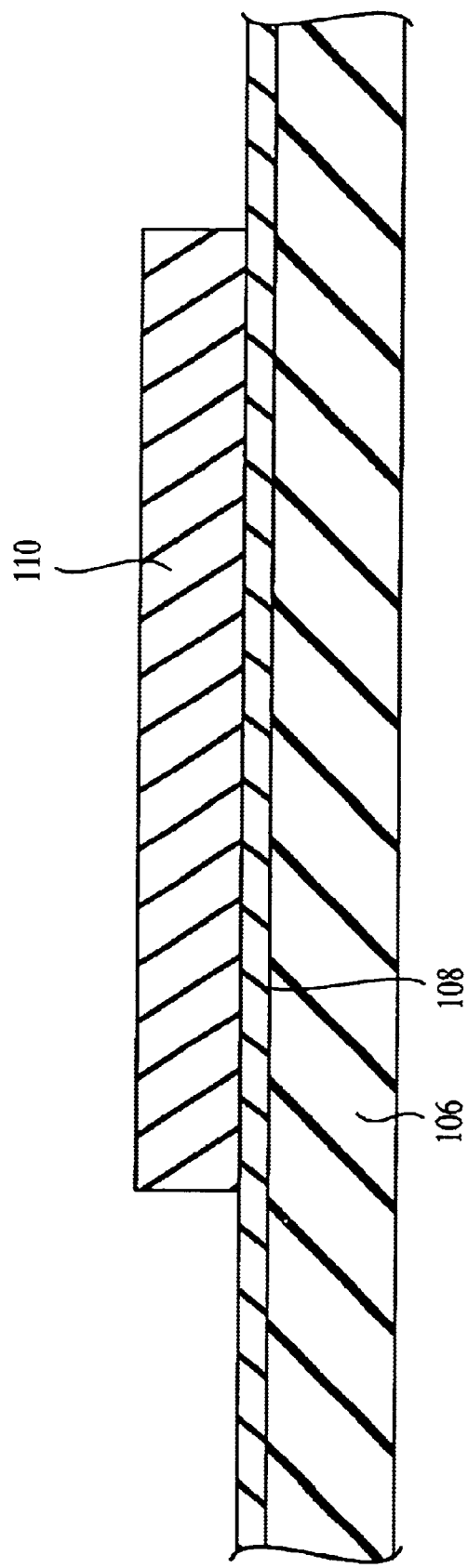

The process for manufacturing the capacitor 100 will be described with reference to FIGS. 5 through 13. Referring to FIG. 5, the support substrate 106 is prepared and formed with the insulating layer 108 over its main surface. The insulating layer 108 may be formed, for example, of a silicon oxide film. This silicon oxide film may be formed by thermally oxidizing the support substrate 106.

In order to form the NBL 110, a semiconductor substrate (not shown) is laid over the main surface of the insulating layer 108. The semiconductor substrate is adhered to the insulating layer 108 by a heat treatment, following which, the semiconductor substrate has its upper surface etched by a polishing treatment to have its thickness reduced. The semiconductor substrate thus thinned is doped all over its main surface with an n-type impurity by, for example, ion implantation. After this, the semiconductor substrate is thermally diffused to form the n+-type buried layer 110. Anisotropic etching, such as Reactive Ion Etching (RIE), may be used to etch the NBL 110 to form the structure shown in FIG. 6.

Figure 7:
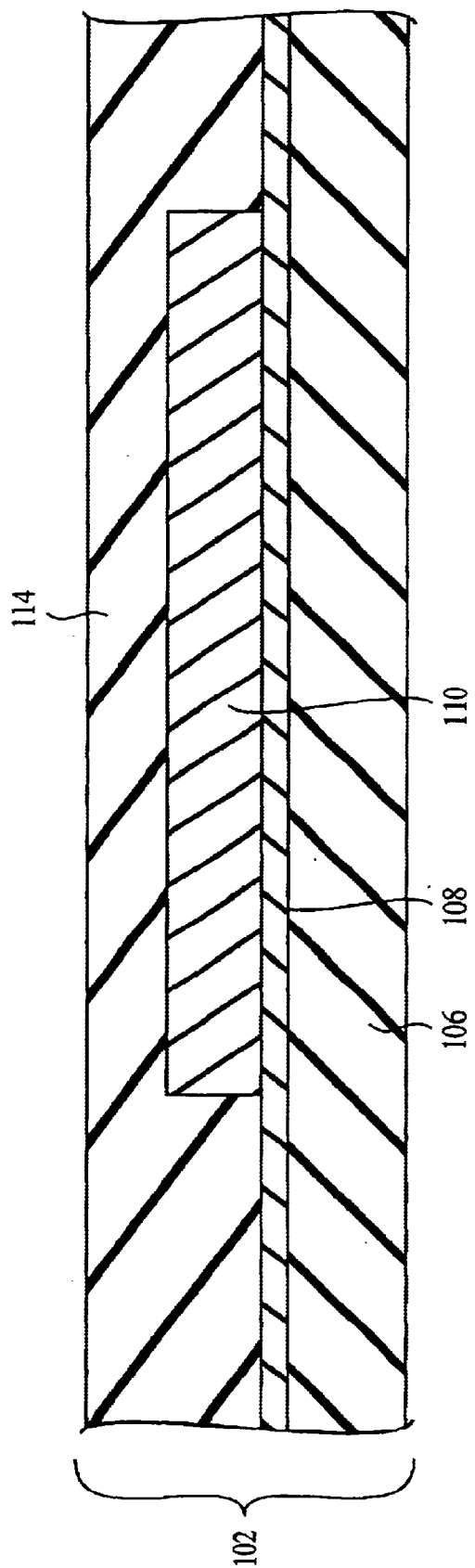

Referring to FIG. 7, the $n^{31}$-type epitaxial layer 114 is grown by epitaxial growth all over the surface of the NBL 110. The NBL 110 has its n-type impurity slightly diffused into the n⁻-type epitaxial layer 114. This results in the SOI substrate 102 having a multi-layered structure that includes the NBL 110 and the n⁻-type epitaxial layer 114 laid over the main surface of the insulating layer 108. The epitaxial layer 114 and the NBL (buried layer) 110 are examples of additional semiconductor layers that may be formed on the insulating layer 108.

Figure 8:
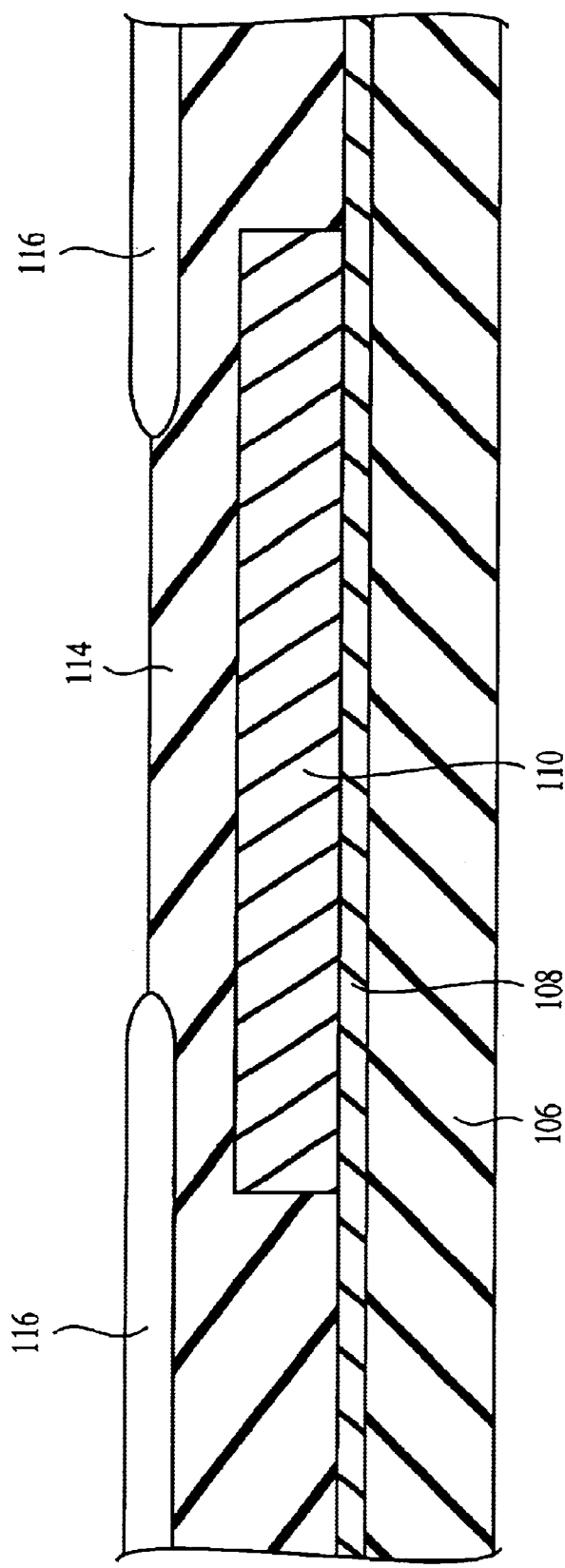

Referring to FIG. 8, the local oxidation silicon layer (LOCOS oxidation) 116 is formed on the epitaxial layer 114. The LOCOS 116 is formed by thermally oxidizing the main surface of the epitaxial layer 114. The LOCOS 116 surrounds a selected surface area of the epitaxial layer 114.

Figure 9:
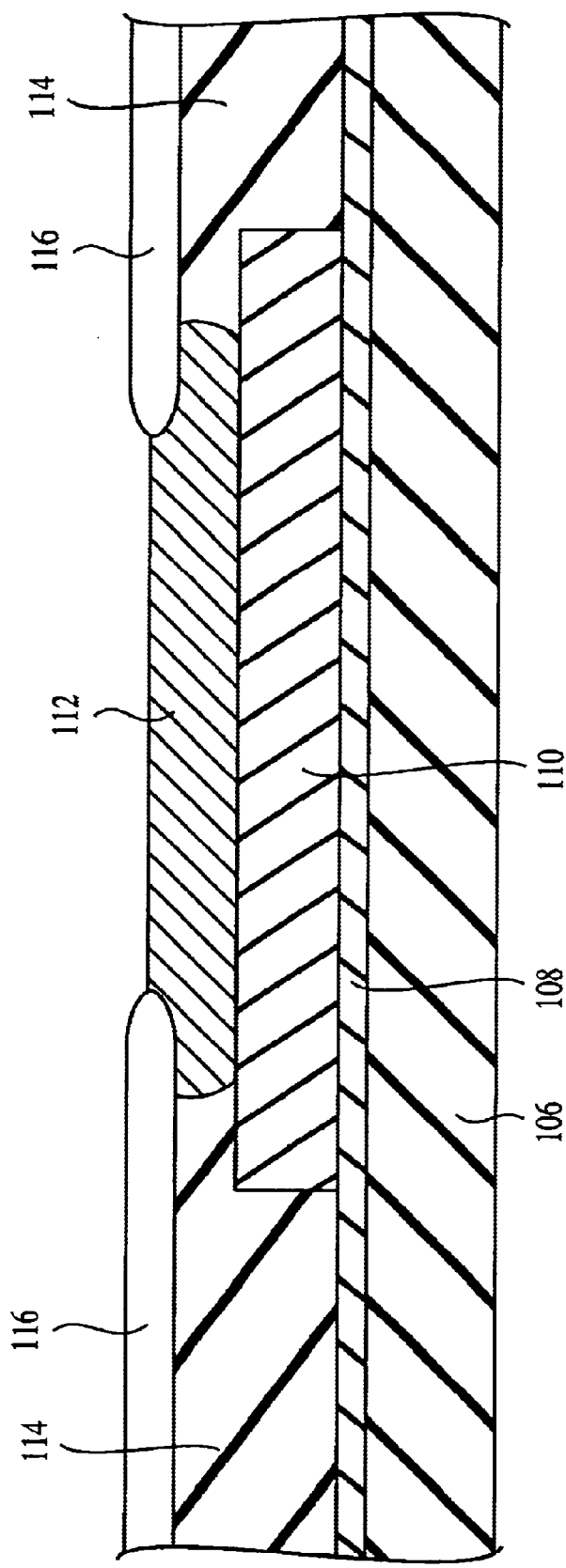

Referring to FIG. 9, the n-type collector (CN) 112 is implanted into the epitaxial layer 114. Specifically, the selected surface area (region) 112 may be selectively doped with an n-type impurity (e.g., phosphor) by ion implantation. Thermal diffusion is carried out to form the n-type collector 112 in the epitaxial layer 114. The collector 112 is preferably heavily doped. Heavily doped generally implies doping concentrations of greater than $10^{18}$ $cm^{-3}$. It should be understood that the collector 112 may alternatively be formed from p-type material.

Figure 10:
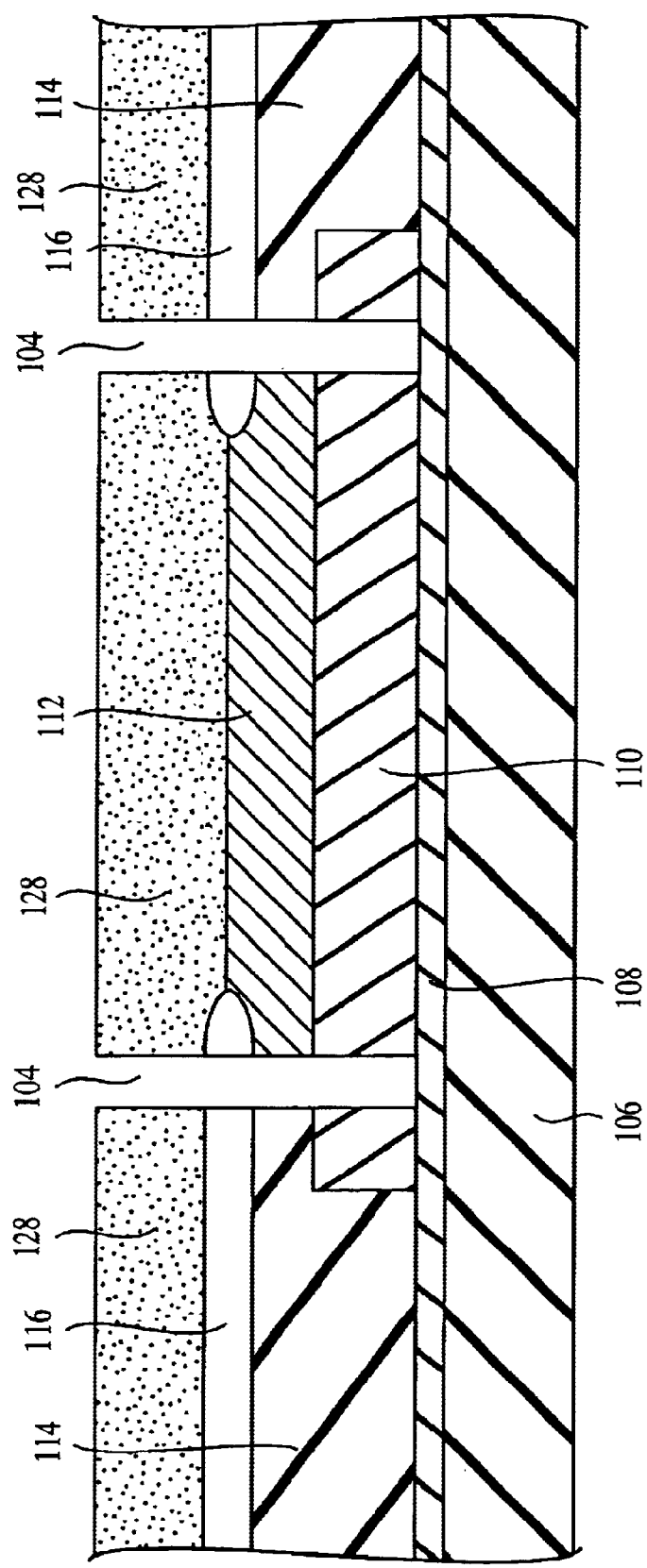

Referring to FIG. 10, the trench 104 is formed by anisotropic etching, such as for example RIE. Specifically, the trench 104 extends from the main surface of the epitaxial layer 114 and the LOCOS 116 to the insulating layer 108. A photoresist 128 may be used as a mask for the etching. Alternatively, a hard mask may be used as a mask for the etching in place of the photoresist 128. After the photoresist 128 is removed, an insulator is buried in the trench 104. This insulator is formed, for example, by depositing a silicon oxide film all over the main surface of the epitaxial layer 114 by the CVD method and by etching back the whole surface of the silicon oxide film. An etch-back is carried out as thick as the deposited silicon oxide film to bury the trench 104 with the silicon oxide. The silicon oxide film is over-etched off except from the inside of the trench 104. The trench 104 could also be filled with other materials, such as for example, oxide/polysilicon.

Figure 11:
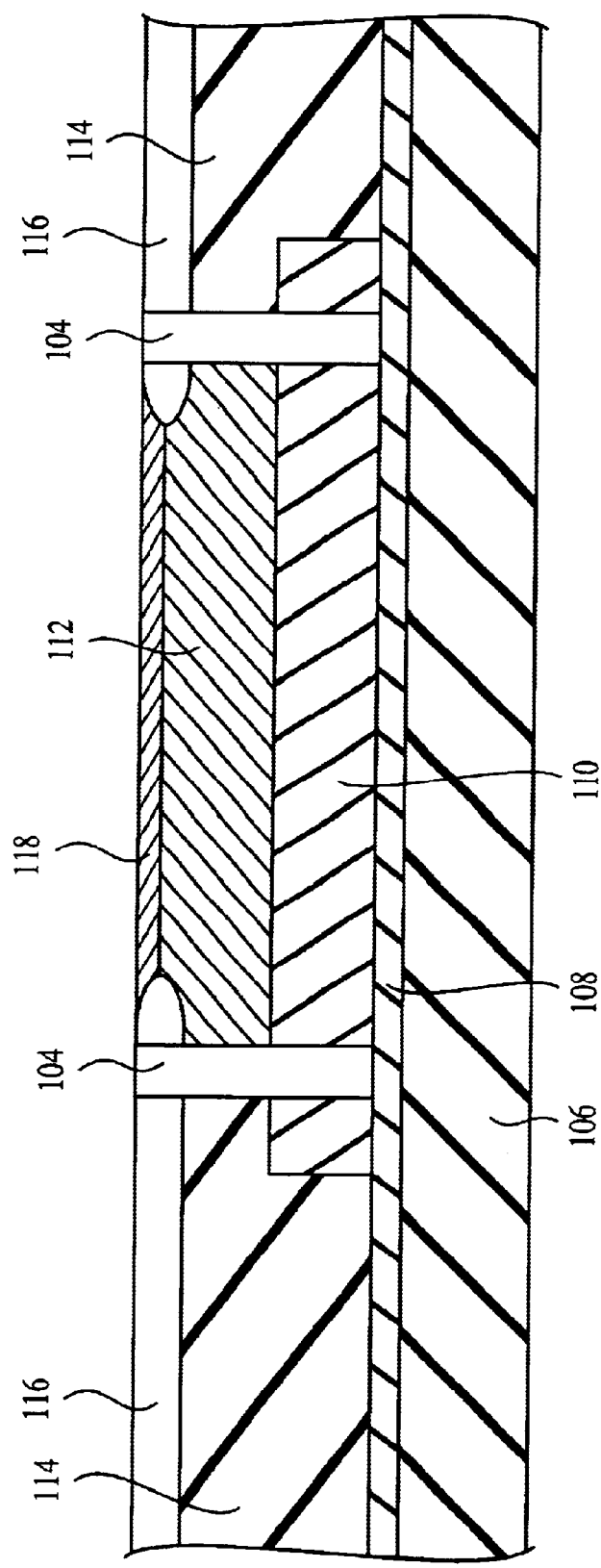
Figure 12:
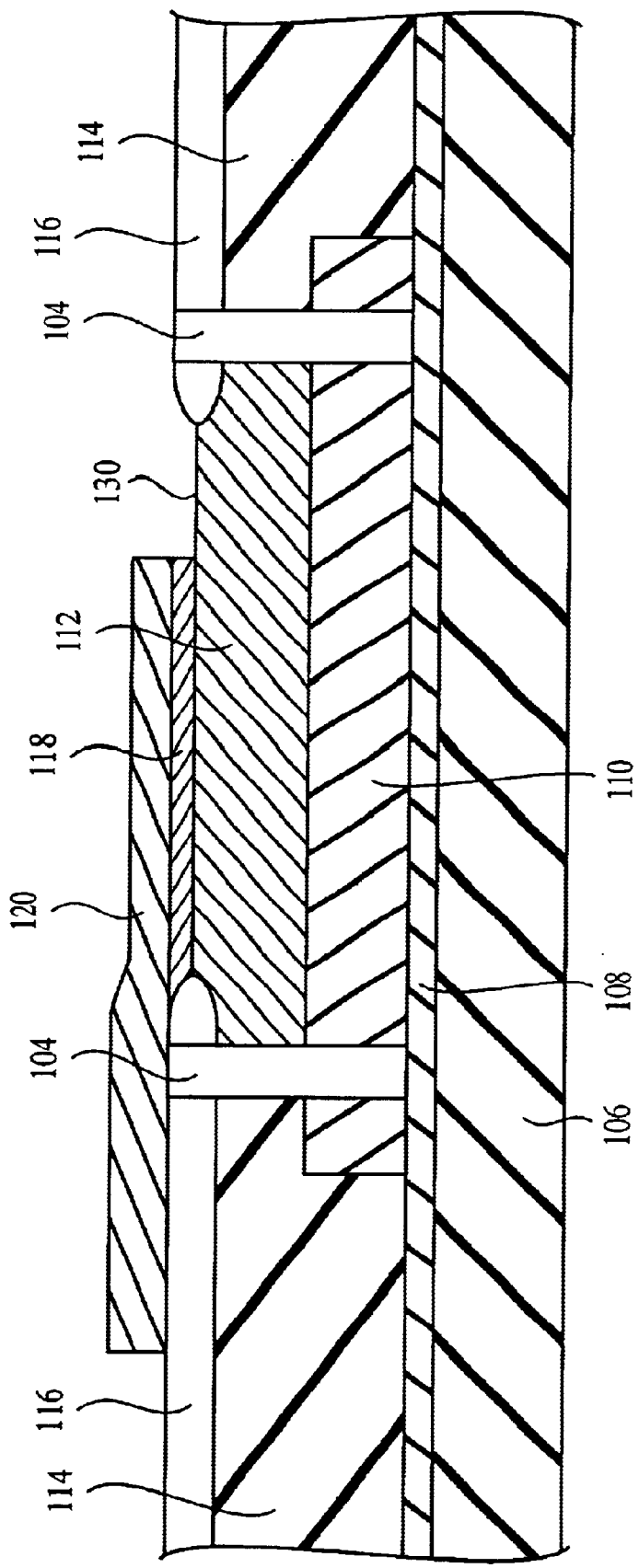

Referring to FIG. 11, the gate oxide layer 118 is formed on the collector 112. Specifically, a thin gate oxide layer 118 is grown over the surface of the collector 112. The polysilicon gate 120 is then formed on the gate oxide layer 118 as shown in FIG. 12. The gate 120 is formed by depositing a polysilicon layer and then heavily doping it by diffusion or implantation of phosphorus. The gate 120 is then patterned such that it extends over a portion of the LOCOS 116. The gate polysilicon extends over the LOCOS oxide so that ohmic contact can be made to the polysilicon. This step also.results in patterning of the gate oxide layer 118 such that a surface area 130 of the collector 112 is exposed.

Figure 13:
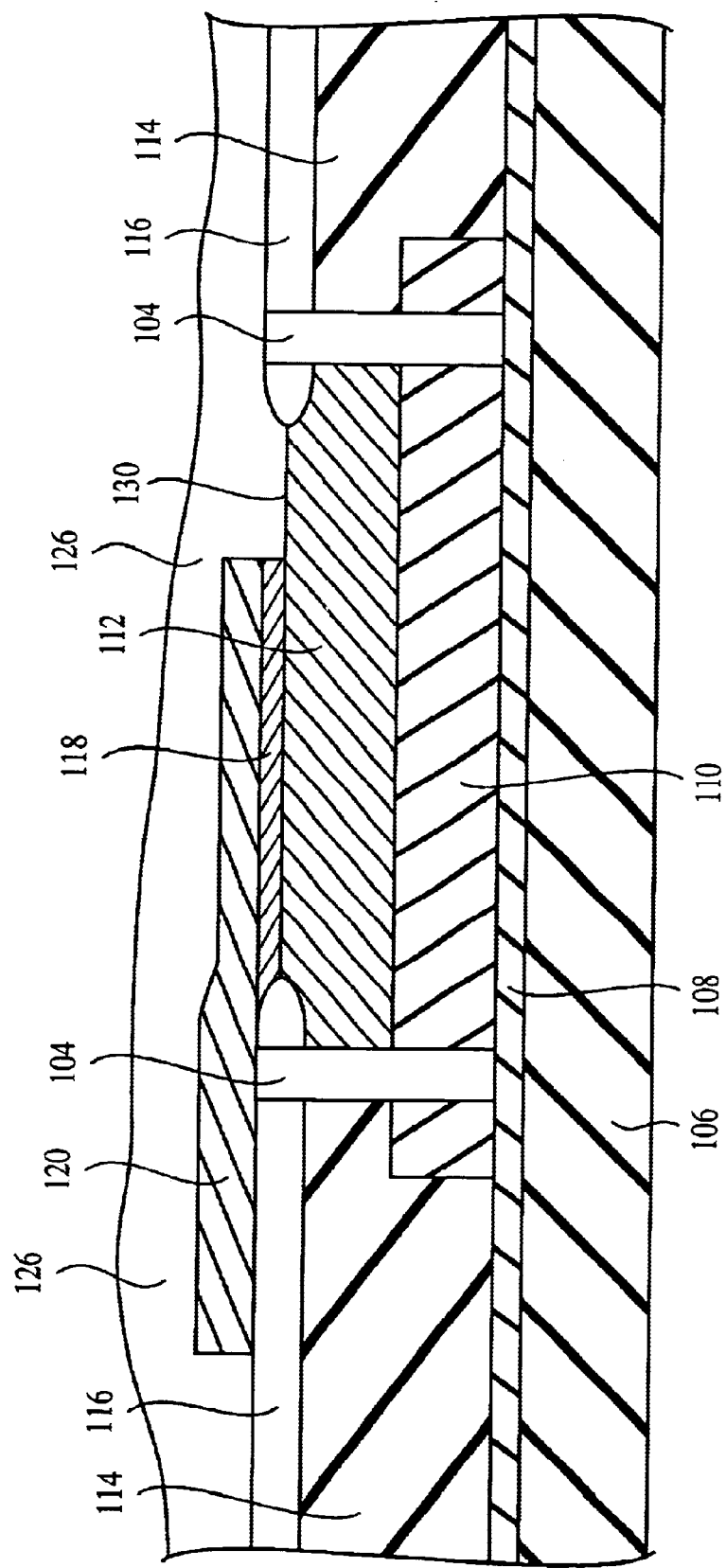

Referring to FIG. 13, a phosphorus-doped oxide 126 (P-glass) is deposited over the entire wafer and is flowed by heating the wafer to give a smooth surface topography. Contact windows are then defined and etched in the P-glass 126. One contact window is made over the gate 120 in the area over the LOCOS 116, and another window is made over the collector 112 in the area of the exposed portion 130. Metal, such as aluminum, is then deposited and patterned to form the metal contacts 122, 124 shown in FIG. 4. The metal contact 122 is made to the exposed portion 130 of the collector 112, and the metal contact 124 is made to the polysilicon gate 120.

The integrated circuit capacitor 100 is particularly useful in, for example, RF applications and may be used as a component in low pass filter (LPF) circuits. The capacitor 100's high density, high isolation, and high Q makes it particularly well-suited for these applications.

It has been found that the silicon-on-insulator (SOI) BICMOS process technology mentioned above that is available from Hitachi Ltd. of Japan, and specifically, the Hitachi Ltd. Device Development Center in Tokyo, Japan, has many characteristics that are preferable to alternative technologies. There are also several features that make it particularly well-suited to RF applications. With SOI, the insulating layer separates circuit devices from the solid silicon substrate. A trench isolation structure may also be used which provides a lateral barrier between circuit elements. These features isolate signals and minimize the undesired coupling that would otherwise limit performance. Because parasitic effects also limit the speed at which a circuit can operate, ICs made with SOI offer exceptional high-frequency operation while minimizing power dissipation. Finally, the isolating properties of the SOI technology allow more functions to be packed into a smaller area. These characteristics translate into advantages in performance, battery life, and size for the end product.

Figure 14:
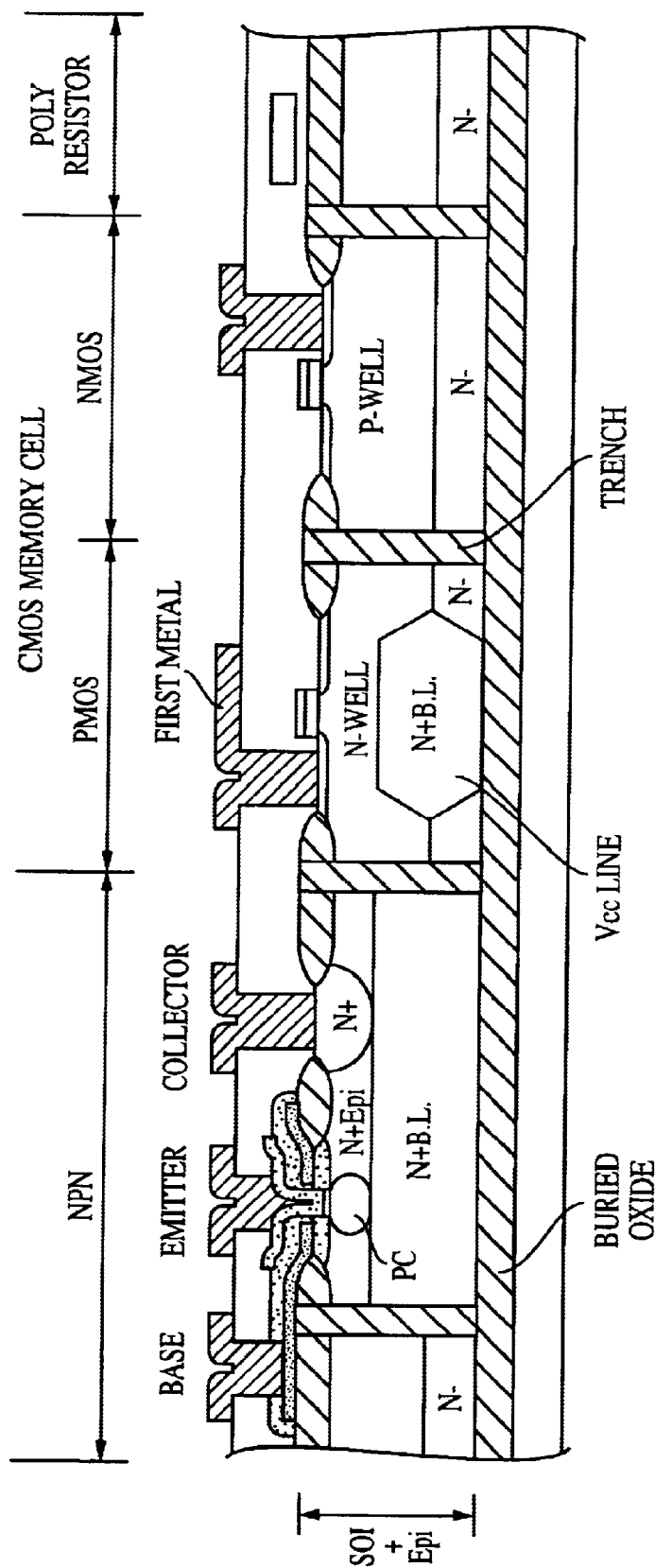
FIG. 14 is a cross-sectional view of semiconductor devices fabricated using a silicon-on-insulator (SOI) process technology.
Figure 15:
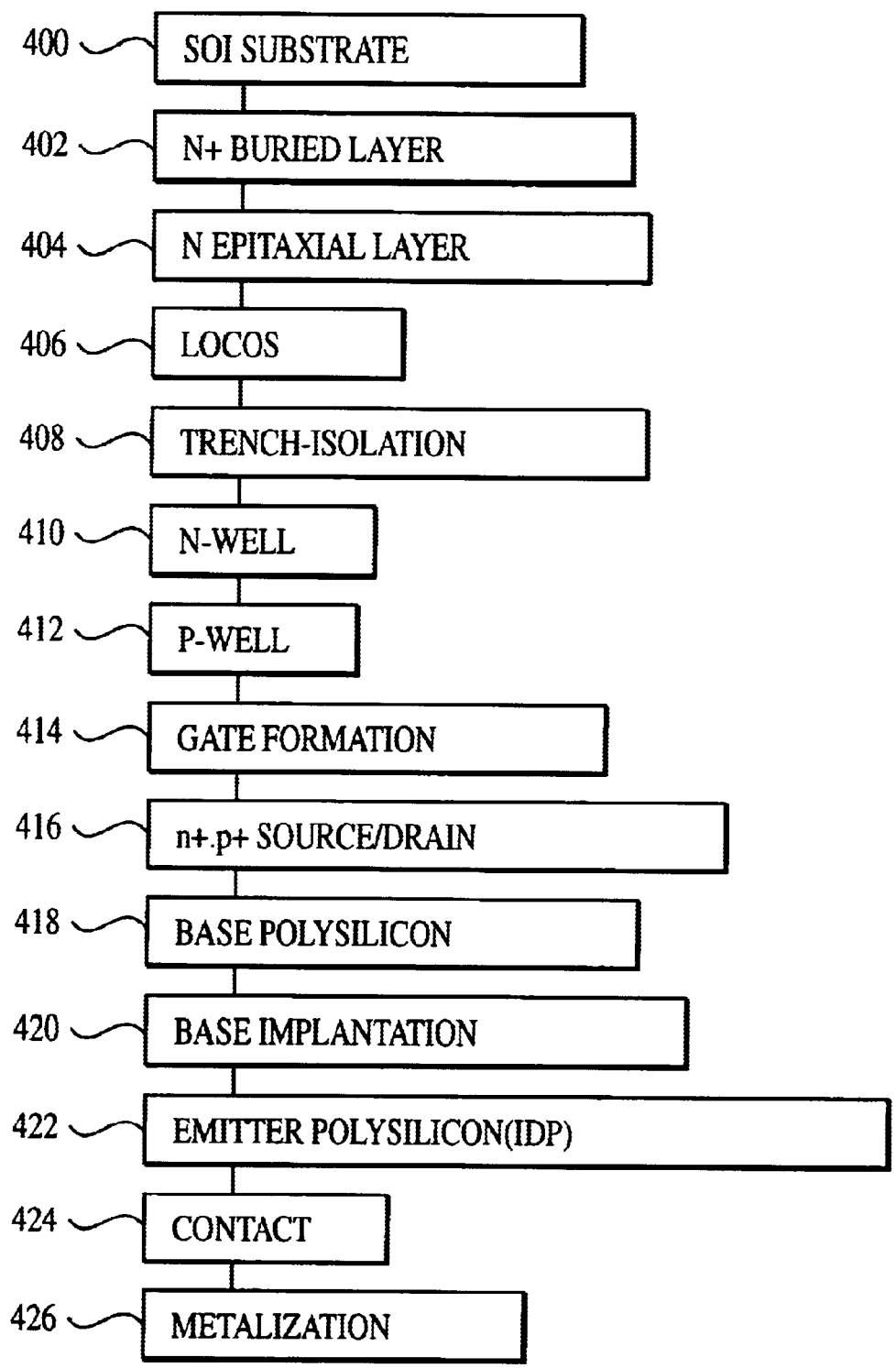
FIG. 15 is a flow diagram illustrating the process steps used to fabricate the semiconductor devices shown in FIG. 14.

Referring to FIG. 14, there is illustrated a cross-section of the ECL-CMOS process technology discussed in the paper entitled "A 0.35 $\mu$m ECL-CMOS Process Technology on SOI for 1 ns Mega-bits. SRAM's with 40 ps Gate Array" mentioned above. FIG. 15 illustrates the general process steps discussed in that same paper.

As stated in the paper, FIG. 14 shows the cross-sectional view of a 0.35$\mu$m ECL-CMOS process technology. A bipolar transistor, 1 bit CMOS memory cell and poly resistor are shown. Three key technologies adopted for this device are SOI substrate, trench isolation and the IDP (In-situ phosphorus doped polysilicon) emitter technology. The bipolar transistor includes double polysilicon self-aligned structure with IDP emitter and the pedestal collector. IDP can avoid the plug effects which causes $f_r$ degradation in a small size emitter. To reduce CMOS memory cell size and to achieve a latch-up free configuration, n+ buried layer for the Vcc line and a trench isolation combined with LOCOS are used.

Referring to FIG. 15, the fabrication process begins in step 400 with the SOI substrate. The starting material is a SOI substrate with 1.5 $\mu$m thick Si layer and 0.5 $\mu$m buried oxide layer. The buried layer is formed in step 402, and the epitaxial layer is formed in step 404. Only $n^{30}$ region is prepared for a buried layer. The voltage drop of buried Vcc line is small enough by reducing sheet resistance of the $n_+$ layer down to about 45 g/square. A 0.7 $\mu$m thick epitaxial layer is grown. The LOCOS is formed in step 406, and the trench isolation is formed in step 408. The thickness of LOCOS oxidation is 0.4 $\mu$m. The trench is formed after LOCOS oxidation. The width of the trench is 0.4 $\mu$m. It is filled and planarized with CVD oxide film. The N-wells and P-wells are formed in steps 410, 412, respectively. The n-well and p-well are formed by high-energy implantation through LOCOS with two masks. Channel implantation is performed simultaneously to control threshold voltage Vth of NMOS and PMOS. The gate is formed in step 414, and the source and collector is formed in step 416. Gate electrodes are formed by $Wsi_2$/polysilicon structure. The thickness of gate oxide is 9 nm. After the gate patterning, the source and drain region is formed. The base is formed in steps 418, 420, and the emitter is formed in step 422. The base and emitter of the bipolar are fabricated by the self-aligned process. Base polysilicon is deposited and a hole is formed in the emitter region. Then, intrinsic base implantation and pedestal collector implantation are carried out. After sidewall spacer of polysilicon was formed, the emitter electrode and shallow emitter were fabricated simultaneously using IDP technology with rapid thermal annealing (RTA) at 950° C. An SOG etch-back technique is used for planarization after PSG deposition and a contract hold formation is followed in step 424. Finally, six layers of metalization is performed in step 426.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. An integrated circuit capacitor, comprising:
   a substrate;
   an insulating layer formed on the substrate;
   a buried layer formed on the insulating layer;
   an epitaxial layer of a first conductivity type formed on the buried layer;
   a local oxidation silicon layer formed on a region of the epitaxial layer that surrounds a first selected surface area of the epitaxial layer, wherein the local oxidation silicon layer is not formed on the first selected surface area of the epitaxial layer;
   a collector implanted into the epitaxial layer in the first selected surface area of the epitaxial layer, wherein the collector is used as a first plate of the integrated circuit capacitor;
   a gate oxide layer formed on a first portion of the collector, wherein the gate oxide layer is used as a dielectric layer of the integrated circuit capacitor, and wherein the gate oxide layer provides a high capacitance per unit area for the integrated circuit capacitor; and
   a polysilicon gate formed on the gate oxide layer and a first portion of the local oxidation silicon layer, wherein the polysilicon gate is used as a second plate of the integrated circuit capacitor;
   a first metal contact formed on a second portion of the collector; and
   a second metal contact formed on the polysilicon gate.

2. An integrated circuit capacitor in accordance with claim 1, wherein the substrate comprises a high resistivity substrate.

3. An integrated circuit capacitor in accordance with claim 1, further comprising:
   an isolation trench formed in the local oxidation silicon layer, the epitaxial layer and the buried layer that extends to the insulating layer and that surrounds the first selected surface area of the epitaxial layer.

4. An integrated circuit capacitor in accordance with claim 3, further comprising:
   oxide that fills the isolation trench.

5. An integrated circuit capacitor in accordance with claim 1, wherein the buried layer comprises an N conductive type material.

6. An integrated circuit capacitor in accordance with claim 1, wherein the collector comprises an N conductivity type material.

7. An integrated circuit capacitor in accordance with claim 1, wherein the collector comprises highly doped material.

8. The integrated circuit capacitor of claim 1, wherein the gate oxide dielectric layer is not thicker than about 9 nm.

9. The integrated circuit capacitor of claim 8, wherein the substrate has a resistivity of at least about 1000 ohms per centimeter.

10. An integrated circuit capacitor, comprising:
    a substrate;
    an insulating layer formed on the substrate;
    a buried layer formed on the insulating layer;
    an epitaxial layer of a first conductivity type formed on the buried layer;
    a local oxidation silicon layer formed on the epitaxial layer that surrounds a first selected-surface area of the epitaxial layer;
    a collector implanted into the epitaxial layer in the first selected surface area of the epitaxial layer;
    a gate oxide layer formed on a first portion of the collector;
    a polysilicon gate formed on the gate oxide layer and a first portion of the local oxidation silicon layer; and
    an isolation trench formed in the local oxidation silicon layer, the epitaxial layer and the buried layer that extends to the insulating layer and that surrounds the first selected surface area of the epitaxial layer;
    a first metal contact formed on a second portion of the collector; and
    a second metal contact formed on the polysilicon gate.

11. An integrated circuit capacitor in accordance with claim 10, further comprising:
    oxide that fills the isolation trench.

12. An integrated circuit capacitor in accordance with claim 10, wherein the substrate comprises a high resistivity substrate.

* * * * *